United States Patent
Si et al.

(10) Patent No.: US 10,996,265 B2
(45) Date of Patent: May 4, 2021

(54) APPARATUS EQUIPPED WITH CRACK DETECTION CIRCUIT AND DETECTION SYSTEM

(71) Applicant: Huawei Technologies Co., Ltd., Shenzhen (CN)

(72) Inventors: Hui Si, Beijing (CN); Haohui Long, Beijing (CN); Jianping Fang, Beijing (CN); Runqing Ye, Shanghai (CN); Weiqiang Hong, Shenzhen (CN); Yunfei Wang, Shenzhen (CN); Taixiang Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 194 days.

(21) Appl. No.: 16/095,858

(22) PCT Filed: Oct. 28, 2016

(86) PCT No.: PCT/CN2016/103732
§ 371 (c)(1),
(2) Date: Oct. 23, 2018

(87) PCT Pub. No.: WO2018/076272
PCT Pub. Date: May 3, 2018

(65) Prior Publication Data
US 2019/0324080 A1    Oct. 24, 2019

(51) Int. Cl.
*G01R 31/28* (2006.01)
*H01L 21/66* (2006.01)

(52) U.S. Cl.
CPC ......... *G01R 31/2856* (2013.01); *H01L 22/34* (2013.01)

(58) Field of Classification Search
CPC .................... G01R 31/2856; H01L 22/34
(Continued)

(56) References Cited

U.S. PATENT DOCUMENTS

| 5,969,260 A | 10/1999 | Belk et al. |
| 8,253,420 B2 * | 8/2012 | Nickel ............... G01R 31/2884 324/762.05 |

(Continued)

FOREIGN PATENT DOCUMENTS

| CN | 101261246 A | 9/2008 |
| CN | 101711365 A | 5/2010 |

(Continued)

OTHER PUBLICATIONS

Texas Instruments; Integrated TIRIS RF Module TMS3705A Introduction to Low Frequency Reader Application Report; Pub. Date Oct. 1999; Texas Instruments; SCBA020; p. 7 (Year: 1999).*

(Continued)

*Primary Examiner* — Melissa J Koval
*Assistant Examiner* — Rahul Maini
(74) *Attorney, Agent, or Firm* — Conley Rose, P.C.

(57) ABSTRACT

A crack detection system and an apparatus equipped with a crack detection circuit, including a main body, and a detection control circuit and a detection coil disposed on the main body. The main body includes a top surface, a bottom surface, and a side surface coupled between the top surface and the bottom surface. The detection coil is distributed on an edge of the main body and disposed surrounding the side surface. Two ends of the detection coil are electrically coupled to the detection control circuit to form a closed-loop detection circuit. The detection circuit is configured to detect a crack in an edge region of the main body. The detection coil includes a plurality of detection sections sequentially coupled from head-to-tail, and adjacent detection sections are not collinear.

20 Claims, 13 Drawing Sheets

(58) Field of Classification Search
USPC .................................................. 324/762.05
See application file for complete search history.

(56) References Cited

U.S. PATENT DOCUMENTS

| | | |
|---|---|---|
| 2005/0212147 A1 | 9/2005 | Nishizawa |
| 2006/0012375 A1 | 1/2006 | Kelsey et al. |
| 2007/0262370 A1 | 11/2007 | Okada |
| 2008/0012572 A1 | 1/2008 | Tsukuda |
| 2009/0108856 A1 | 4/2009 | Yonushonis et al. |
| 2010/0146341 A1 | 6/2010 | Chen et al. |
| 2011/0304328 A1 | 12/2011 | Yamamoto |
| 2015/0247896 A1 | 9/2015 | Lacroix et al. |
| 2016/0278003 A1 | 9/2016 | Kim et al. |

FOREIGN PATENT DOCUMENTS

| | | |
|---|---|---|
| CN | 101750556 A | 6/2010 |
| CN | 102171579 A | 8/2011 |
| CN | 102334028 A | 1/2012 |
| CN | 103328989 A | 9/2013 |
| CN | 203587560 U | 5/2014 |
| CN | 104914157 A | 9/2015 |
| CN | 205016497 U | 2/2016 |
| CN | 105372857 A | 3/2016 |
| JP | H07142637 A | 6/1995 |
| JP | 2006041420 A | 2/2006 |
| JP | 2007305739 A | 11/2007 |
| JP | 2008506950 A | 3/2008 |
| JP | 2008191995 A | 8/2008 |
| JP | 2016040669 A | 3/2016 |

OTHER PUBLICATIONS

Machine Translation and Abstract of Chinese Publication No. CN102171579, dated Aug. 31, 2011, 8 pages.
Machine Translation and Abstract of Chinese Publication No. CN105372857, dated Mar. 2, 2016, 18 pages.
Machine Translation and Abstract of Japanese Publication No. JP2006041420, dated Feb. 9, 2006, 22 pages.
"Test Structures for Bumpy Integrated Circuits," NTIS Tech Notes, US Department of Commerce. Springfield, VA, US, Apr. 1, 1990, XP000127996, 2 pages.
Foreign Communication From A Counterpart Application, European Application No. 16920069.8, Extended European Search Report dated Jan. 8, 2019, 7 pages.
Foreign Communication From A Counterpart Application, PCT Application No. PCT/CN2016/103732, English Translation of International Search Report dated Aug. 9, 2017, 2 pages.
Machine Translation and Abstract of Chinese Publication No. CN101261246, dated Sep. 10, 2008, 8 pages.
Machine Translation and Abstract of Chinese Publication No. CN104914157, dated Sep. 16, 2015, 21 pages.
Machine Translation and Abstract of Chinese Publication No. CN203587560, dated May 7, 2014, 6 pages.
Foreign Communication From A Counterpart Application, Chinese Application No. 201680079779.8, Chinese Office Action dated Apr. 28, 2019, 10 pages.
Foreign Communication From A Counterpart Application, Chinese Application No. 201680079779.8, Chinese Office Action dated Nov. 4, 2019, 10 pages.
Machine Translation and Abstract of Chinese Publication No. CN205016497, dated Feb. 3, 2016, 10 pages.

* cited by examiner

APPARATUS EQUIPPED WITH CRACK DETECTION CIRCUIT AND DETECTION SYSTEM

CROSS-REFERENCE TO RELATED APPLICATIONS

This application is a U.S. National Stage of International Patent Application No. PCT/CN2016/103732 filed on Oct. 28, 2016, which is hereby incorporated by reference in its entirety.

TECHNICAL FIELD

This application relates to the field of electronic technologies, and specifically, to an apparatus equipped with a crack detection circuit and a detection system.

BACKGROUND

In recent years, a cutting technology has been widely applied in a process of fragmenting substrates such as a wafer, touchscreen glass, and a liquid crystal display. However, in a cutting process, these to-be-cut substrates are very likely to generate a crack after suffering cutting stress due to poor toughness and high brittleness. Consequently, problems such as poor reliability and a failure arise on a cut substrate fragment (also referred to as a cut unit).

In the prior art, a crack detection line extending along one direction is disposed on one detection surface of a cut unit, and whether a crack intersecting the crack detection line exists on the cut unit is determined by detecting a breaking status of the crack detection line. However, a direction of a cutting crack is uncertain. In other words, a crack in any direction may be generated in a cutting process. A crack detection line extending along only one direction exists on one detection surface of the cut unit. In this case, only a cutting crack intersecting the foregoing unidirectional extending crack detection line can be detected. If there is a cutting crack that does not intersect the crack detection line, the cutting crack cannot be detected in the prior art, causing low crack detection precision for the cut unit.

How to detect a crack on the cut unit more precisely is continuously researched in the industry.

SUMMARY

Embodiments of this application provide an apparatus equipped with a crack detection circuit and a detection system, to improve crack detection precision and crack detection efficiency.

According to one aspect, an embodiment of this application provides an apparatus equipped with a crack detection circuit, including a main body, and a detection control module and a detection coil that are disposed on the main body, where the main body includes a top surface, a bottom surface, and a side surface connected between the top surface and the bottom surface; the detection coil is distributed on an edge of the main body, and at least a part of the detection coil is disposed surrounding the side surface; two ends of the detection coil are electrically connected to the detection control module, to form a closed-loop detection circuit, and the detection circuit is configured to detect a crack in an edge region of the main body; and the detection coil includes a plurality of detection sections that are sequentially connected head-to-tail, and adjacent detection sections are not collinear.

In this embodiment of this application, the detection coil is disposed surrounding the side surface, and the adjacent detection sections are not collinear. In other words, an included angle exists between the adjacent detection sections, and the adjacent detection sections extend in different directions. In this way, cracks in different directions can be detected. Therefore, this application can improve crack detection precision and crack detection efficiency.

In an implementation, the detection coil includes a plurality of detection line units that are sequentially connected in series, and each detection line unit includes at least two detection sections.

For example, each detection line unit extends in a Z shape, a V shape, or a parabolic shape.

In an implementation, each detection line unit includes a first detection line, a second detection line, and a pair of third detection lines, the first detection line extends along an extension direction of an edge of the top surface, the second detection line extends along an extension direction of an edge of the bottom surface, a position of the first detection line and a position of the second detection line are staggered, one of the pair of third detection lines is connected between the first detection line and the second detection line, and the other of the pair of third detection lines is connected between the second detection line and a first detection line of a neighboring detection line unit.

Further, in each detection line unit, the first detection line and the second detection line extend in a same direction, and the pair of third detection lines extend in a same direction.

In an implementation, the detection coil surrounds the side surface to extend for at least two circles, the at least two circles of detection coils are arranged in a direction perpendicular to the side surface, and detection line units of adjacent circles are spaced from each other.

In an implementation, detection sections of adjacent circles are disposed in a staggered manner.

In an implementation, an outermost detection coil is disposed on the side surface, and another detection coil is embedded inside the side surface.

In an implementation, the detection coil is embedded inside the main body or exposed on an outer surface of the main body.

In an implementation, the main body is a chip, a glass substrate, or a liquid crystal panel.

According to another aspect, an embodiment of this application provides a crack detection system, including a detection device and the apparatus equipped with a crack detection circuit in any one of the foregoing implementations, where the detection device includes a coupling coil and a detection device control module that are electrically interconnected; the detection device control module is configured to provide an electrical signal for the coupling coil, to implement coupling between the coupling coil and the detection coil, so that an induced current is generated to supply power to the detection control module; and the detection device detects, by determining connection or disconnection of the detection coil, whether a crack exists on the main body.

BRIEF DESCRIPTION OF DRAWINGS

To describe the technical solutions in the embodiments of this application or in the prior art more clearly, the following briefly describes the accompanying drawings required for describing the embodiments. Apparently, the accompanying drawings in the following description show merely some embodiments of this application, and a person of ordinary skill in the art may still derive other drawings from these accompanying drawings without creative efforts.

FIG. 1-2 is a schematic diagram of crack detection performed by an apparatus equipped with a crack detection circuit according to an embodiment of this application;

FIG. 2-1 is a schematic structural diagram of a first detection line unit according to an embodiment of this application;

FIG. 2-2 is a schematic diagram of crack detection performed by using a first detection line unit according to an embodiment of this application;

FIG. 3-1 is a schematic structural diagram of a second detection line unit according to an embodiment of this application;

FIG. 3-2 is a schematic diagram of crack detection performed by using a second detection line unit according to an embodiment of this application;

FIG. 4-1 is a schematic structural diagram of a third detection line unit according to an embodiment of this application;

FIG. 4-2 is a schematic diagram of crack detection performed by using a third detection line unit according to an embodiment of this application;

FIG. 5-1 and FIG. 5-2 are schematic structural diagrams of a horizontally surrounding detection coil according to an embodiment of this application;

FIG. 6-1 is a schematic structural diagram of a first horizontally surrounding detection coil according to an embodiment of this application;

FIG. 6-2 is a schematic diagram of crack detection performed by using a first horizontally surrounding detection coil according to an embodiment of this application;

FIG. 12-1 is a schematic structural diagram of a first vertically surrounding detection coil according to an embodiment of this application;

FIG. 12-2 is a schematic diagram of crack detection performed by using a first vertically surrounding detection line unit according to an embodiment of this application;

FIG. 17-1 is a schematic diagram of crack detection performed by a crack detection system according to an embodiment of this application;

DESCRIPTION OF EMBODIMENTS

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are merely some rather than all of the embodiments of this application. All other embodiments obtained by a person of ordinary skill in the art based on the embodiments of this application without creative efforts shall fall within the protection scope of this application.

Figure 1:
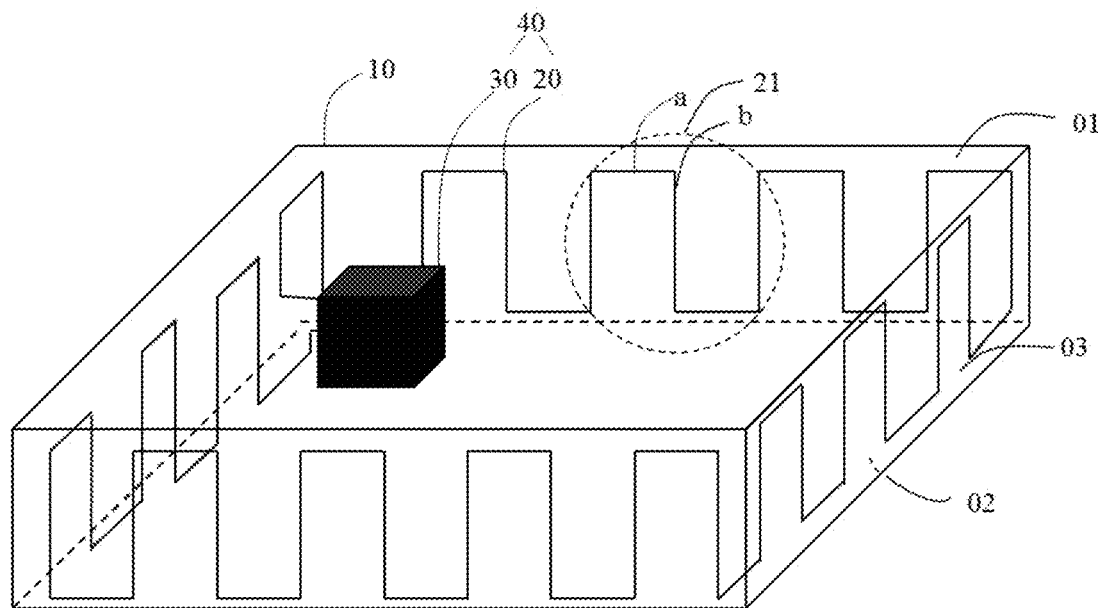
FIG. 1-1 is a schematic structural diagram of an apparatus equipped with a crack detection circuit according to an embodiment of this application.

Referring to FIG. 1-1, FIG. 1-1 is a schematic structural diagram of an apparatus equipped with a crack detection circuit according to an embodiment of this application. The apparatus includes a main body 10, and a detection control module 30 and a detection coil 20 that are disposed on the main body 10. Specifically, the detection control module 30 and the detection coil 20 may be disposed on an outer surface of the main body 10 or pre-embedded inside the main body 10. The main body 10 includes a top surface 01, a bottom surface 02, and a side surface 03 connected between the top surface 01 and the bottom surface 02, and the top surface 01 and the bottom surface 02 are disposed opposite to each other. The main body 10 is a cut unit, namely, a cut substrate fragment. The detection coil 20 is disposed on an edge of the main body 10, and at least a part of the detection coil 20 is disposed surrounding the side surface 03. Specifically, the detection coil 20 may be disposed surrounding the edge of the main body 10 internally along the side surface of the main body 10, or the detection coil 20 may be disposed surrounding the edge of the main body 10 externally along the side surface of the main body 10. Alternatively, the detection coil 20 may be disposed on another location of the main body 10. Two ends of the detection coil 20 are electrically connected to the detection control module 30, to form a closed-loop detection circuit 40. The detection circuit 40 may detect a crack in an edge region of the main body 10. The detection coil 20 includes a plurality of detection sections that are sequentially connected head-to-tail (as shown in FIG. 1, a detection section a and a detection section b are two adjacent detection sections), and any two adjacent detection sections a and b are not collinear. In FIG. 1-1, the detection section a and the detection section b are horizontal and vertical detection sections, respectively. In another implementation, the detection section a and the detection section b may be detection sections that are not collinear in any directions and that have one intersecting point.

Figures 1, 2:
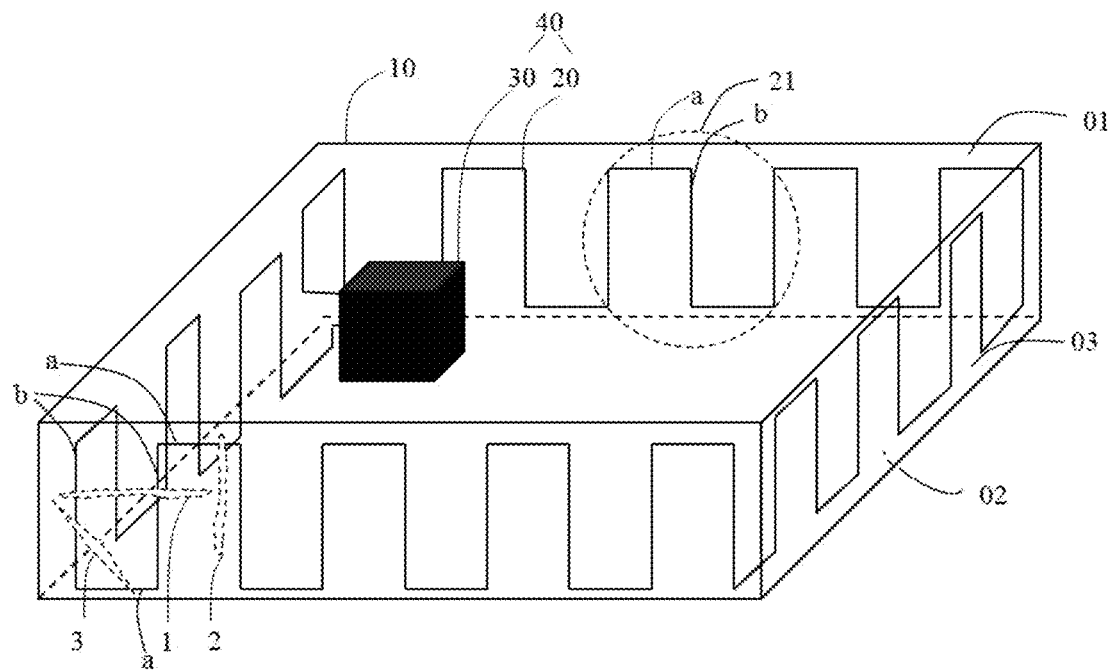
Figures 1, 2:
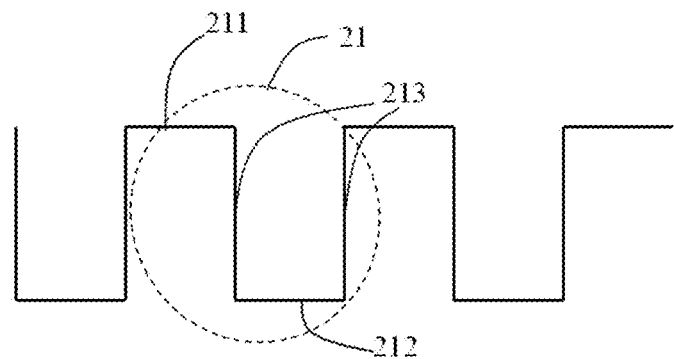
Figure 2:
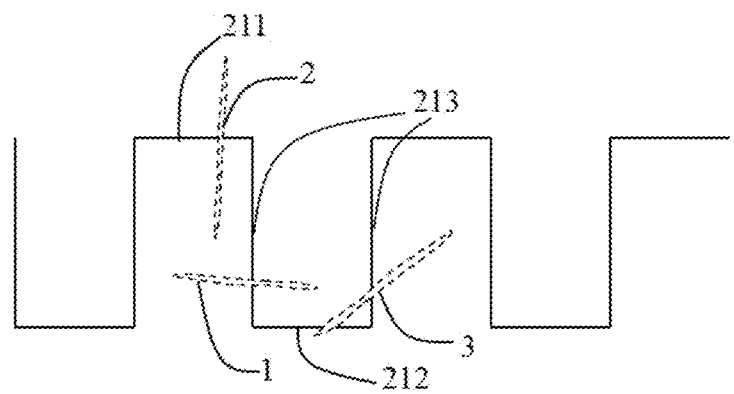

Referring to FIG. 1-2, FIG. 1-2 is a schematic diagram of crack detection performed by an apparatus equipped with a crack detection circuit according to an embodiment of this application. As shown in FIG. 1-2, in a cutting process, a horizontally extending crack 1, a vertically extending crack 2, and an obliquely extending crack 3 are generated on a main body 10. A detection section a and a detection section b that extend in different directions are disposed on the main body 10. The crack 1 intersects the detection section b in an extension process. The detection section b breaks due to tensile stress generated from the crack 1 in the extension process. Therefore, a crack existing on the main body 10 can be determined by detecting a breaking status of the detection section. Likewise, the vertically extending crack 2 intersects the detection section a in an extension process, and the obliquely extending crack 3 intersects the detection section a and the detection section b in an extension process. The detection section breaks due to tensile stress generated in a crack extension process. Therefore, a crack existing on the main body 10 can be determined by detecting a breaking status of the detection section.

In this embodiment of this application, the detection coil 20 is disposed surrounding the side surface 03 of the detection main body 10, and the adjacent detection section a and detection section b of the detection coil 20 are not collinear. In other words, an included angle exists between the adjacent detection section a and detection section b, and the adjacent detection section a and detection section b extend in different directions. In this case, the detection sections extend in a plurality of directions on a detection surface (a surface with the detection sections disposed), and the detection coil can detect cracks in different directions. In comparison with the prior art in which a unidirectional extending detection line is disposed, in this embodiment of this application, the apparatus equipped with a crack detection circuit can improve crack detection precision and crack detection efficiency.

The detection coil 20 may include detection line units 21 that are sequentially connected in series. Further, the detection coil 20 may include a plurality of same detection line units 21 that are sequentially connected in series. Each detection line unit 21 includes at least two detection sections a and at least two detection sections b. Referring to FIG. 1-1 and FIG. 1-2, the detection coil 20 includes a plurality of detection line units 21 that are sequentially connected in series. Each detection line unit 21 includes a horizontally extending detection section a, a vertically extending detection section b, a horizontally extending detection section a, and a vertically extending detection section b that are sequentially connected. The detection line unit 21 includes a plurality of detection sections a and b extending in different directions and may detect cracks extending horizontally, vertically, and obliquely. The detection coil 20 including the detection line unit 21 can detect multi-directional cracks, thereby improving crack detection precision for the main body.

In another implementation, the detection section a and the detection section b may extend in any directions, as long as the detection section a and the detection section b are not collinear. The detection line unit 21 may include combinations of the detection sections a and the detection sections b. Therefore, the detection line unit 21 may extend in a Z shape, a V shape, or a parabolic shape, or in another two-dimensional or three-dimensional shape.

To detect the cracks that extend horizontally, vertically, and obliquely on the main body, referring to FIG. 2-1, each detection line unit 21 includes a first detection line 211, a second detection line 212, and a pair of third detection lines 213. The first detection line 211 extends along an extension direction of an edge of the top surface 01 of the main body 10. The second detection line 212 extends along an extension direction of an edge of the bottom surface 02 of the main body. A position of the first detection line 211 and a position of the second detection line 212 are staggered. One of the pair of third detection lines 213 is connected between the first detection line 211 and the second detection line 212, and the other of the pair of third detection lines 213 is connected between the second detection line 212 and a first detection line 211 of a neighboring detection line unit 21. The first detection line 211 and the second detection line 212 may be configured to detect cracks that extend vertically and obliquely. The first detection line 211 and the second detection line 212 extend along the extension directions of the edges of the top surface 01 and the bottom surface 02 of the main body 10, respectively, and are staggered from each other and configured to detect cracks on the edges of the top surface 01 and the bottom surface 02 of the main body, thereby increasing a crack detection range on the main body. A pair of third detection lines 213 may be configured to detect cracks that extend horizontally and obliquely. The first detection line 211 and the second detection line 212 are connected by using the third detection lines 213, so that the four detection lines are distributed in a staggered manner, and each detection line unit 21 can detect the cracks that extend horizontally, vertically, and obliquely.

Detection line units in different shapes and statuses of crack detection performed by using the detection line units are described in detail in the following three specific implementations.

In a first implementation, referring to FIG. 2-1, FIG. 2-1 is a schematic structural diagram of a first detection line unit according to an embodiment of this application. In each detection line unit 21, the first detection line 211 and the second detection line 212 extend in a same direction. The pair of third detection lines 213 extend in a same direction. The third detection line 213 is connected between the first detection line 211 and the second detection line 212. Further, the third detection line 213 may be connected perpendicular to and between the first detection line 211 and the second detection line 212.

Referring to FIG. 2-2, FIG. 2-2 is a schematic diagram of crack detection performed by using a first detection line unit according to an embodiment of this application. In a cutting process, a horizontally extending crack 1, a vertically extending crack 2, and an obliquely extending crack 3 are generated on a main body 10. A crack detection circuit is disposed on the main body 10. The crack detection circuit includes detection line units 21 that are sequentially connected in series. Each detection line unit 21 includes a first detection line 211 extending along an edge of a top surface 01 of the main body 10, a second detection line 212 that is in parallel with a direction of the first detection line 211 and that extends along an edge of a bottom surface 02 of the main body, and a pair of third detection lines 213 that are connected perpendicular to and between the first detection line 211 and the second detection line 212. The horizontally extending crack 1 intersects the third detection lines 213 in an extension process, the vertically extending crack 2 intersects the first detection line 211 in an extension process, and the obliquely extending crack 3 intersects the second detection line 212 and the third detection lines 213 in an extension process. The detection line unit 21 breaks due to tensile stress generated from the cracks in the extension process. Therefore, a crack existing on the main body can be determined by detecting a breaking status of the detection line unit 21.

Figures 1, 3:
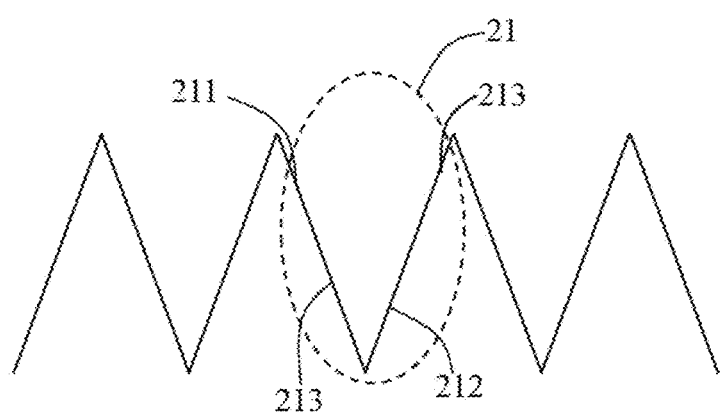
Figures 2, 3:
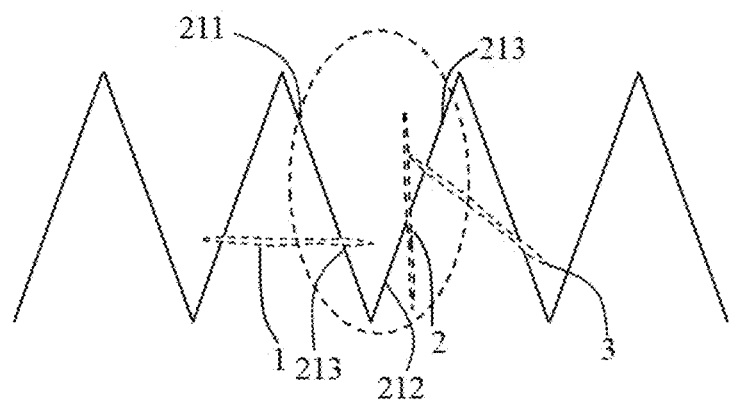

In a second implementation, referring to FIG. 3-1, FIG. 3-1 is a schematic structural diagram of a second detection line unit according to an embodiment of this application. Different from the first implementation, in this implementation, a first detection line 211 and one of third detection lines 213 of a detection line unit 21 are collinear, and a second detection line 212 and the other of third detection lines 213 are collinear. The first detection line 211 and the second detection line 212 do not extend along a top surface and a bottom surface of a main body. The first detection line 211 extends in a direction with left higher than right, the second detection line 212 extends in a direction with left lower than right, and the first detection line 211 and the second detection line 212 have one intersecting point. Therefore, the detection line unit 21 extends in a V shape. Referring to FIG. 3-2, FIG. 3-2 is a schematic diagram of crack detection performed by using a second detection line unit according to an embodiment of this application. In a cutting process, a horizontally extending crack 1, a vertically extending crack 2, and an obliquely extending crack 3 are generated on a main body 10. A crack detection circuit is disposed on the main body 10. The crack detection circuit includes detection line units 21 extending in a V shape. Each detection line unit includes a first detection line 211 and a third detection line 213 that extend along a direction with left higher than right, and a second detection line 212 and a third detection line 213 that extend along a direction with left lower than right. The crack 1 intersects a second detection line 212 of a left-side detection line unit and the third detection line 213 in an extension process, the vertically extending crack 2 intersects the second detection line 212 in an extension process, and the obliquely extending crack 3 intersects the third detection line 213 and a third detection line 213 of a right-side detection line unit in an extension process. The detection line units break due to tensile stress generated from the cracks in the extension process. Therefore, a crack existing on the main body can be determined by detecting a breaking status of the detection line unit.

Figures 1, 4:
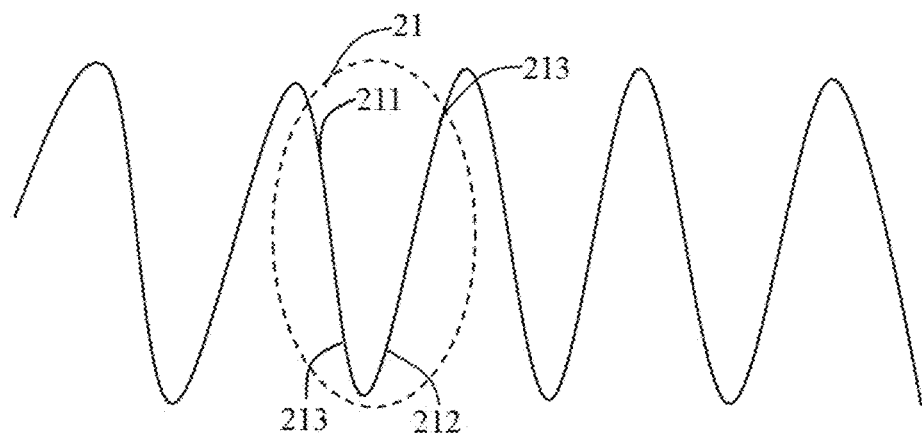
Figures 2, 4:
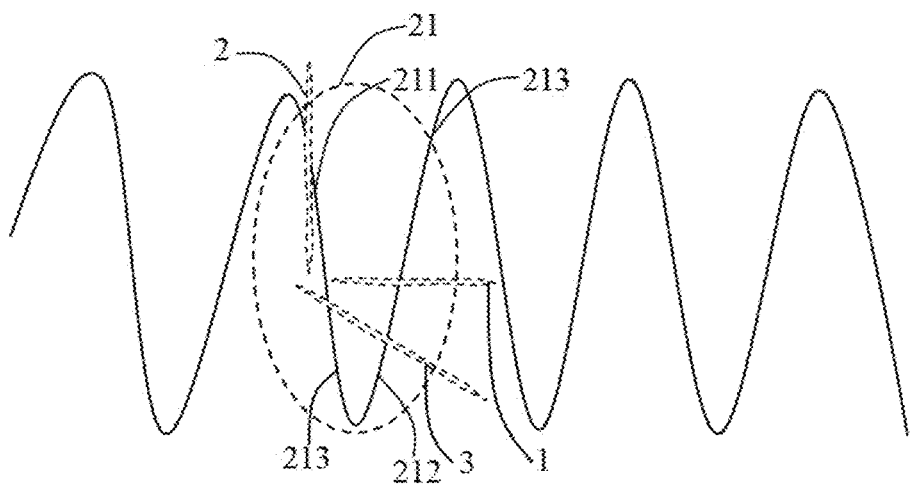

In a third implementation, referring to FIG. 4-1, FIG. 4-1 is a schematic structural diagram of a third detection line unit according to an embodiment of this application. Different from the second implementation, in this implementation, four detection lines of a detection line unit are curves. Therefore, the detection line unit 21 extends in a parabolic shape. Referring to FIG. 4-2, FIG. 4-2 is a schematic diagram of crack detection performed by using a third detection line unit according to an embodiment of this application. In a cutting process, a horizontally extending crack 1, a vertically extending crack 2, and an obliquely extending crack 3 are generated on a main body 10. A crack detection circuit is disposed on the main body 10. The crack detection circuit includes detection line units 21 extending in a parabolic shape. Each detection line unit includes a first detection line 211 and a third detection line 213 that extend along a curve direction with left higher than right, and a second detection line 212 and a third detection line 213 that extend along a curve direction with left lower than right. The crack 1 intersects the second detection line 212 in an extension process, the vertically extending crack 2 intersects the first detection line 211 in an extension process, and the obliquely extending crack 3 intersects the third detection line 213 and the second detection line 212 in an extension process. The detection line unit breaks due to tensile stress generated from the cracks in the extension process. Therefore, a crack existing on the main body can be determined by detecting a breaking status of the detection line unit.

In the foregoing three implementations, the detection line unit includes detection sections extending in at least two directions. In other words, the first detection line and the second detection line are not collinear. Therefore, the detection line unit can detect the cracks that extend horizontally, vertically, and obliquely. In comparison with the prior art in which a detection line unit has a detection section extending in only one direction and only a horizontally extending crack or a vertically extending crack can be detected, the apparatus equipped with a crack detection circuit provided in this application can improve crack detection precision, and increase a product yield rate.

Lengths of the detection sections are not limited in this application. In theory, shorter detection sections result in more densely distributed detection line units. In this way, the detection line units can detect more cracks in a detection region, and detection precision is higher.

In this application, the detection sections are detection lines that are adjacent but in different directions and detection lines that are in a same direction but not adjacent.

It can be learned from the first implementation that a single detection coil can detect a crack intersecting the detection coil. However, after the main body is cut, an origin generating a crack is uncertain. The crack may be close to an edge of the main body or may be close to a center of the main body. The crack close to the center of the main body is unlikely to intersect a detection coil distributed along the edge. Therefore, in an implementation, the detection coil 20 surrounds the side surface 03 of the main body to extend for at least two circles, the at least two circles of detection coils 20 are arranged in a direction perpendicular to the side surface 03, and detection line units 21 of adjacent circles are spaced from each other. A quantity of circles of and a gap between the detection coils are not limited in this application and may be adjusted depending on actual application.

Figures 1, 5:
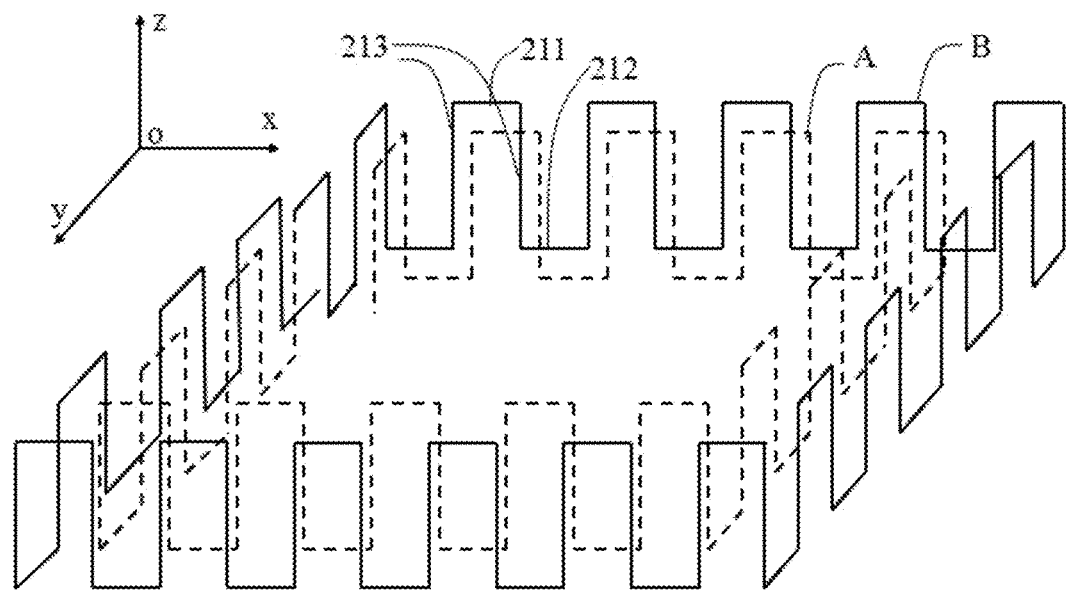
Figures 2, 5:
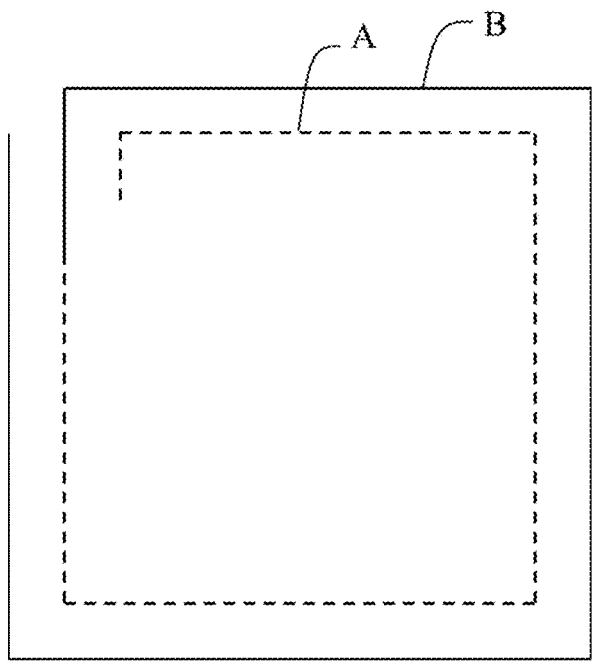

Specifically, referring to FIG. 5-1 and FIG. 5-2, FIG. 5-1 and FIG. 5-2 are schematic structural diagrams of a horizontally surrounding detection coil according to an embodiment of this application. The detection coil includes an inner detection coil A and an outer detection coil B that are connected head-to-tail. The inner detection coil A and the outer detection coil B are formed by horizontal surrounding of a plurality of detection line units that are sequentially connected. Several detection coils may be included between the inner detection coil A and the outer detection coil B, and are not shown in the figure. An arrangement manner of the inner detection coil A and the outer detection coil B includes a horizontal arrangement manner and a horizontal staggered arrangement manner. For details, refer to the following five specific implementations.

Figures 1, 6:
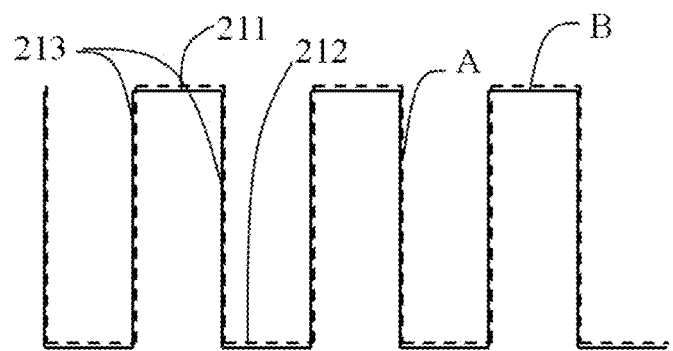
Figures 2, 6:
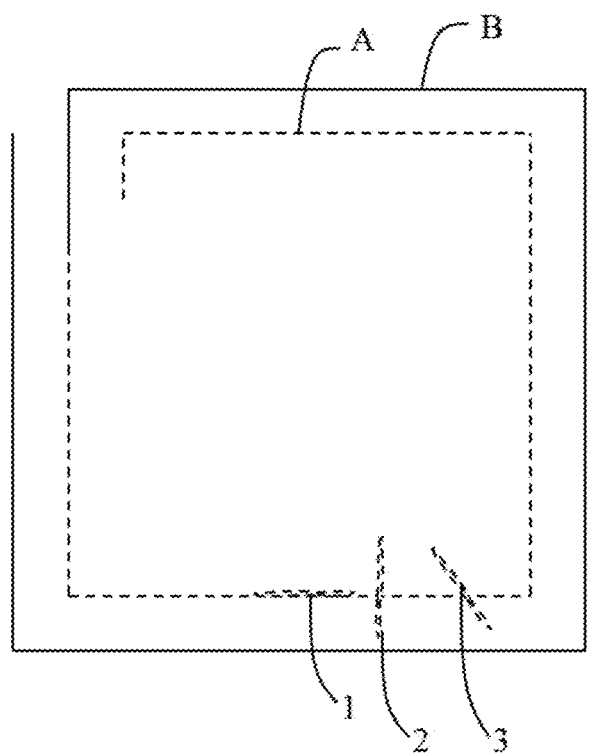

In a fourth implementation, referring to FIG. 6-1, FIG. 6-1 is a schematic structural diagram of a first horizontally surrounding detection coil according to an embodiment of this application. In this implementation, the detection coil is formed by surrounding of an inner detection coil A and an outer detection coil B in a horizontal arrangement manner. The inner detection coil A and the outer detection coil B are located on a same horizontal plane. Each detection coil includes a plurality of first detection lines 211 extending along a top surface of a main body, a plurality of second detection lines 212 extending along a bottom surface of the main body, and a plurality of third detection lines 213 connected to the first detection lines 211 and the second detection lines 212.

Referring to both FIG. 6-1 and FIG. 6-2, FIG. 6-2 is a schematic diagram of crack detection performed by using a first horizontally surrounding detection coil according to an embodiment of this application. In a cutting process, a horizontally extending crack 1, a vertically extending crack 2, and an obliquely extending crack 3 that are close to a center are generated on a main body 10. A crack detection circuit is disposed on the main body 10. The crack detection circuit includes an inner detection coil A and an outer detection coil B. The cracks 1, 2, and 3 intersect a first detection line 211, a second detection line 212, and a third detection line 213 of the inner detection coil A in an extension process. The detection coil breaks due to tensile stress generated from the cracks in the extension process. Therefore, a crack existing on the main body can be determined by detecting a breaking status of the detection coil. In this implementation, the detection coil is disposed as the detection coil A and the detection coil B that are distributed internally and externally, respectively, and can detect a tiny crack in a relatively large range of the main body, thereby improving detection precision.

Figure 7:
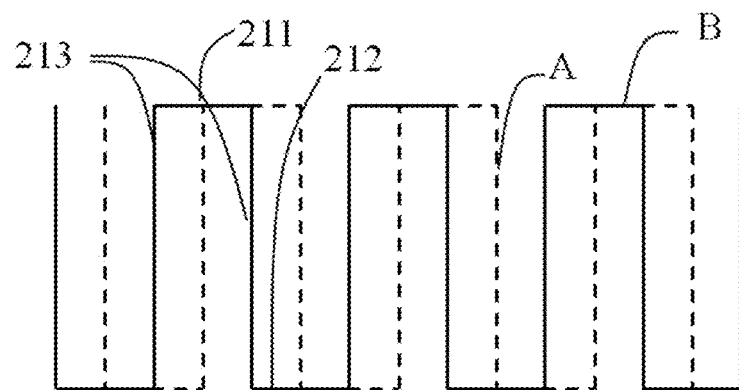
FIG. 7 is a schematic structural diagram of a second horizontally surrounding detection coil according to an embodiment of this application.

In a fifth implementation, referring to FIG. 7, FIG. 7 is a schematic structural diagram of a second horizontally surrounding detection coil according to an embodiment of this application. In comparison with the fourth implementation, in this embodiment, detection sections of adjacent circles are disposed in a staggered manner. To be specific, the detection coil is formed by surrounding of an inner detection coil A and an outer detection coil B in a horizontal staggered arrangement manner. The inner detection coil A and the outer detection coil B are located on a same horizontal plane. Each detection coil includes a plurality of first detection lines 211 extending along a top surface of a main body, a plurality of second detection lines 212 extending along a bottom surface of the main body, and a plurality of third detection lines 213 connected to the first detection lines 211 and the second detection lines 212. An inner detection section and an outer detection section are staggered by a distance in a horizontal direction, and the distance is less than a length of the first detection line 211. In comparison with the fourth implementation, in this implementation, more extensive crack detection can be implemented. Specifically, detection sections of all detection coils correspond to each other and are not staggered. Therefore, cracks that can pass through a gap between the detection sections of the outer coil B can also pass through a gap between the detection sections of the inner coil A, and these cracks do not intersect the detection sections and are difficult to detect. In this implementation, the detection sections of the outer coil B and the detection sections of the inner detection coil A are arranged in a staggered manner. Therefore, a crack passing through a gap between the detection sections of the outer coil B may intersect the detection sections of the inner detection coil A, so that the detection sections break. Therefore, the crack can be detected, and crack detection precision can be improved.

Figure 8:
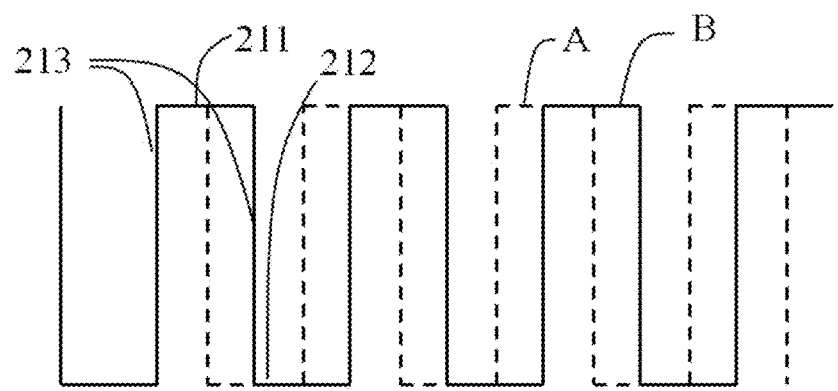
FIG. 8 is a schematic structural diagram of a third horizontally surrounding detection coil according to an embodiment of this application.

In a sixth implementation, referring to FIG. 8, FIG. 8 is a schematic structural diagram of a third horizontally surrounding detection coil according to an embodiment of this application. A difference between this implementation and the fifth implementation lies in that an inner detection coil A and an outer detection coil B are staggered by a distance in a horizontal direction, and the distance is greater than a length of a first detection line 211.

Figure 9:
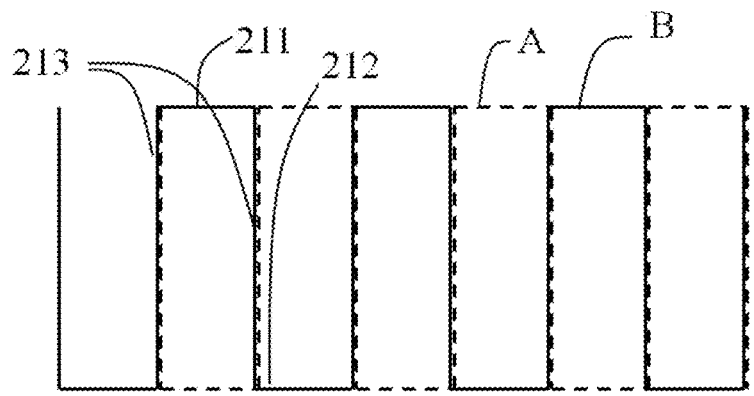
FIG. 9 is a schematic structural diagram of a fourth horizontally surrounding detection coil according to an embodiment of this application.

In a seventh implementation, referring to FIG. 9, FIG. 9 is a schematic structural diagram of a fourth horizontally surrounding detection coil according to an embodiment of this application. A difference between this implementation and the fifth implementation lies in that an inner detection coil A and an outer detection coil B are staggered by a distance in a horizontal direction, and the distance is equal to a length of a first detection line 211.

Figure 10:
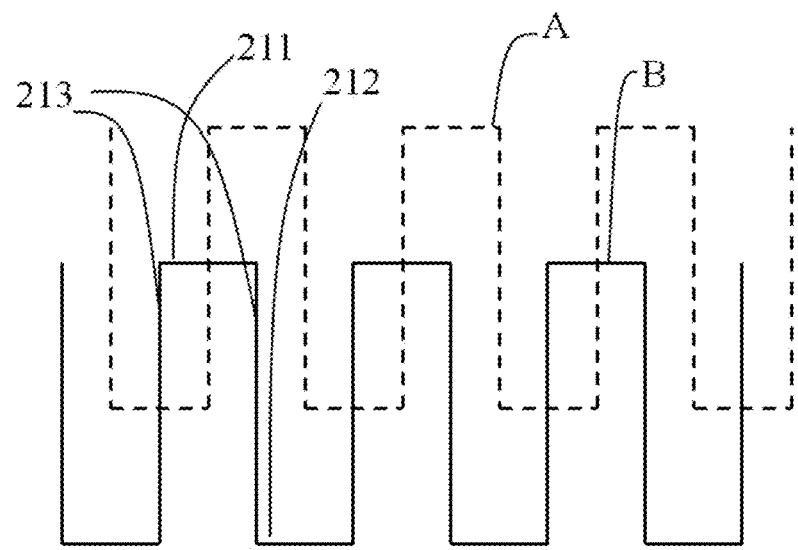
FIG. 10 is a schematic structural diagram of a fifth horizontally surrounding detection coil according to an embodiment of this application.

In an eighth implementation, referring to FIG. 1-1 and FIG. 10, FIG. 10 is a schematic structural diagram of a fifth horizontally surrounding detection coil according to an embodiment of this application. A difference between this implementation and the fifth implementation lies in that an inner detection coil A and an outer detection coil B are staggered by a distance in a horizontal direction, where the distance is less than a length of a first detection line 211, and the inner detection coil A and the outer detection coil B are staggered by a distance in a vertical direction, where the distance is less than a length of a third detection line 213. A first detection line 211 of the inner detection coil A extends along a top surface of a main body, and a second detection line 212 of the outer detection coil B extends along a bottom surface of the main body. In this implementation, a distribution area of the detection lines is larger on the main body. Therefore, more tiny cracks can be detected, and detection precision can be improved.

In the foregoing implementations, the detection line unit may be in a Z shape, a V shape, a parabolic shape, or another two-dimensional or three-dimensional shape. In addition, a gap between detection coils is not limited in this application. In theory, a smaller gap between the detection coils results in more densely distributed detection sections. In this way, the detection sections can detect more cracks on the main body, and detection precision is higher.

In the foregoing implementations, an outermost detection coil is disposed internally surrounding a side surface of the main body. In another implementation, the outermost detection coil may be disposed externally surrounding the side surface, and another detection coil is embedded inside the side surface.

Figure 11:
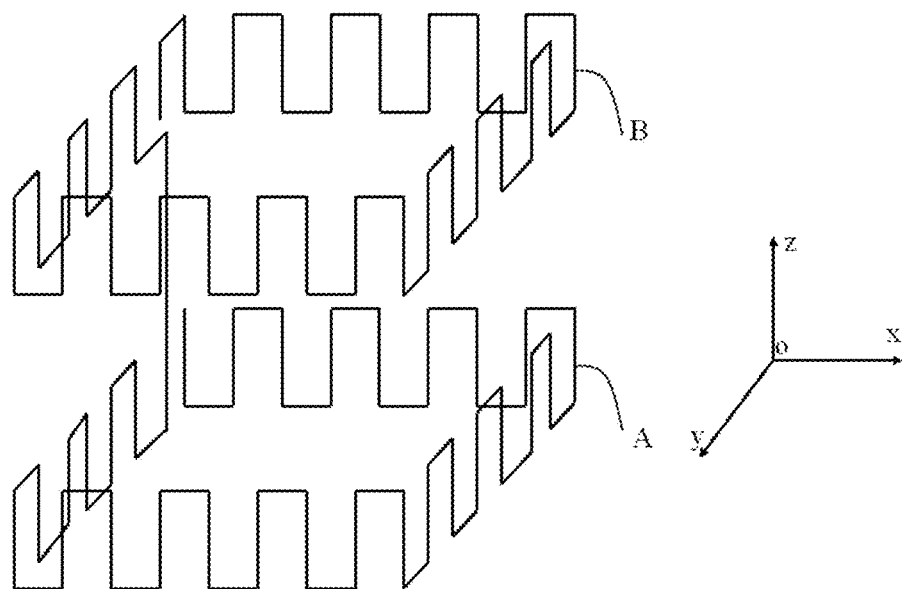
FIG. 11 is a schematic structural diagram of a vertically surrounding detection coil according to an embodiment of this application.

It can be learned from the first implementation that a single detection coil includes a plurality of first detection lines 211 extending along the top surface of the main body, a plurality of second detection lines 212 extending along the bottom surface of the main body, and a plurality of third detection lines 213 connected to the first detection lines 211 and the second detection lines 212. When a gap between the top surface and the bottom surface of the main body is relatively large, a gap between the first detection line 211 and the second detection line 212 is also relatively large. In this case, a tiny crack existing on the gap or a crack that passes through the gap and that does not intersect the detection lines cannot be detected. In an implementation, the detection coil 20 may be formed by vertical surrounding of a plurality of detection line units 21 that are sequentially connected. Referring to FIG. 11, FIG. 11 is a schematic structural diagram of a vertically surrounding detection coil according to an embodiment of this application. The detection coil 20 includes a bottom detection coil C and a top detection coil D that are connected head-to-tail. The bottom detection coil C and the top detection coil D each are formed by horizontal surrounding of a plurality of detection line units 21 that are sequentially connected. Several detection coils may be included between the bottom detection coil C and the top detection coil D, and are not shown in the figure. An arrangement manner of the bottom detection coil C and the top detection coil D includes a vertical arrangement manner and a vertical staggered arrangement manner. For details, refer to the following five specific implementations.

Figures 1, 12:
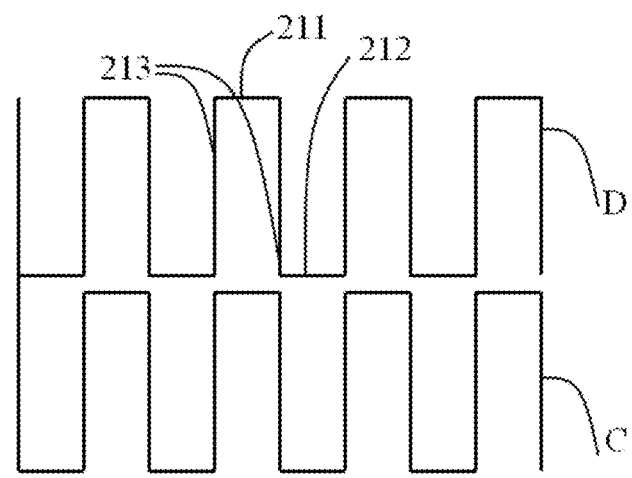
Figures 2, 12:
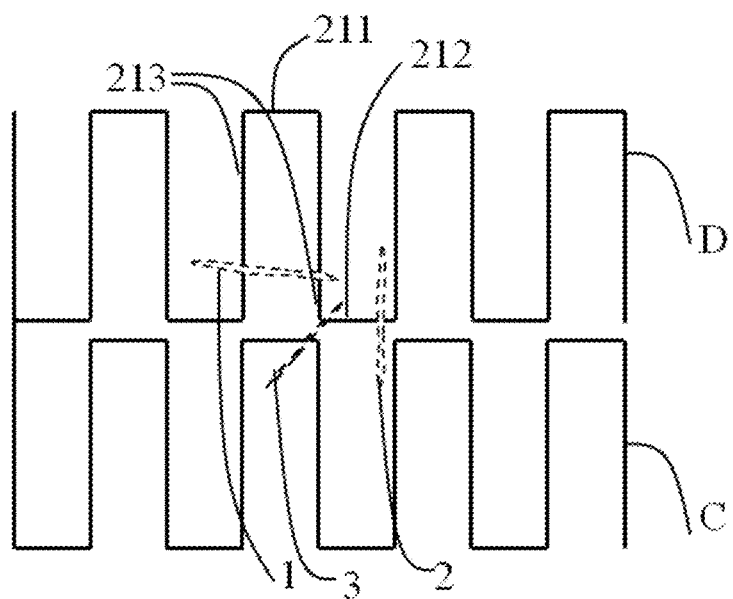

In a ninth implementation, referring to FIG. 12-1, FIG. 12-1 is a schematic structural diagram of a first vertically surrounding detection coil according to an embodiment of this application. In this embodiment, the detection coil is formed by surrounding of a bottom detection coil C and a top detection coil D in a vertical superposition arrangement manner. The bottom detection coil C and the top detection coil D are located on a same vertical plane. Each detection coil includes a plurality of horizontal first detection lines 211, a plurality of horizontal second detection lines 212, and a plurality of vertical third detection lines 213. Second detection lines of the bottom detection coil C extend along a top surface of a main body, and first detection lines of the top detection coil D extend along a bottom surface of the main body. A structure of the top detection coil D is the same as a structure of the bottom detection coil C. In other words, the bottom detection coil C can overlap with the top detection coil D after moving upward a distance along a coordinate axis Z (vertically). Referring to FIG. 12-2, FIG. 12-2 is a schematic diagram of crack detection performed by using a first vertically surrounding detection line unit according to an embodiment of this application. In a cutting process, a horizontally extending crack 1 and an obliquely extending crack 3 are generated on a main body. The crack 1 intersects the first detection line 211 and third detection lines 213 in an extension process, and the obliquely extending crack 3 intersects a second detection line 212 of a detection coil D and a first detection line 211 of a detection coil C in an extension process. The detection line unit breaks due to tensile stress generated from the cracks in the extension process. Therefore, a crack existing on the main body can be determined by detecting a breaking status of the detection line unit. Further, in this implementation, for a tiny vertically extending crack 2 generated on the main body, the crack 2 is far less than a distance between a top surface and a bottom surface of the main body, and cannot be detected in the first implementation. In this implementation, at least two vertically superposed detection coils are disposed on the main body 10, and the vertically extending crack 2 intersects the second detection line 212 of the top detection coil D in an extension process. In this way, the vertically extending crack 2 can be detected. Therefore, based on the first implementation, crack detection precision is further improved in this implementation.

Figure 13:
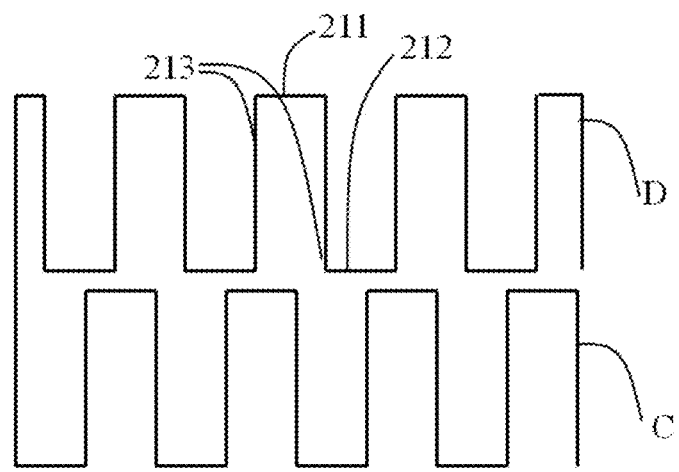
FIG. 13 is a schematic structural diagram of a second vertically surrounding detection coil according to an embodiment of this application.

In a tenth implementation, referring to FIG. 13, FIG. 13 is a schematic structural diagram of a second vertically surrounding detection coil according to an embodiment of this application. Based on the ninth implementation, in this implementation, a top detection coil D and a bottom detection coil C are staggered by a distance in a horizontal direction, and the distance is less than a length of a first detection line. In comparison with the ninth implementation, in this implementation, detection lines close to the top of the bottom detection coil C and the bottom of the top detection coil D are distributed wider. Therefore, more tiny cracks can be detected in this implementation.

Figure 14:
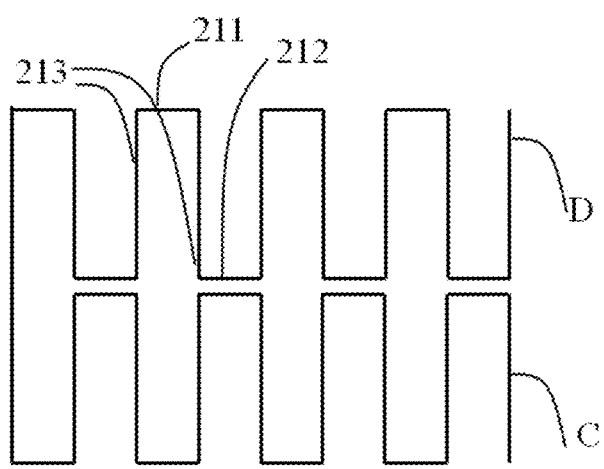
FIG. 14 is a schematic structural diagram of a third vertically surrounding detection coil according to an embodiment of this application.

In an eleventh implementation, referring to FIG. 14, FIG. 14 is a schematic structural diagram of a third vertically surrounding detection coil according to an embodiment of this application. Based on the ninth implementation, in this implementation, a top detection coil D and a bottom detection coil C are staggered by a distance along a coordinate axis X, and the distance is equal to a length of a first detection line. In comparison with the ninth implementation, in this implementation, detection lines close to the top of the bottom detection coil C and the bottom of the top detection coil D are distributed in a more centralized manner. Therefore, a crack can be detected more precisely in this implementation.

Figure 15:
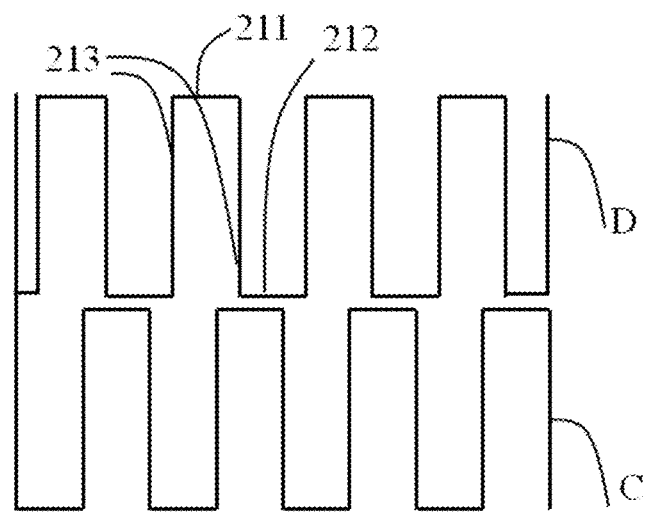
FIG. 15 is a schematic structural diagram of a fourth vertically surrounding detection coil according to an embodiment of this application.

In a twelfth implementation, referring to FIG. 15, FIG. 15 is a schematic structural diagram of a fourth vertically surrounding detection coil according to an embodiment of this application. Based on the ninth implementation, in this implementation, a top detection coil D and a bottom detection coil C are staggered by a distance in a horizontal direction, and the distance is greater than a length of a first detection line. In comparison with the ninth implementation, in this implementation, detection lines close to the top of the bottom detection coil C and the bottom of the top detection coil D are distributed in a more centralized manner. Therefore, a crack can be detected more precisely in this implementation.

Figure 16:
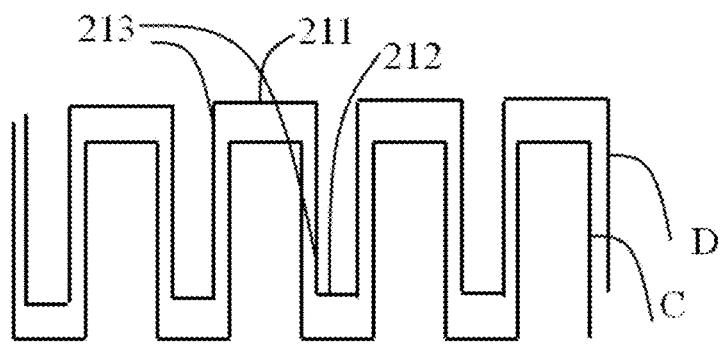
FIG. 16 is a schematic structural diagram of a fifth vertically surrounding detection coil according to an embodiment of this application.

In a thirteenth implementation, referring to FIG. 16, FIG. 16 is a schematic structural diagram of a fifth vertically surrounding detection coil according to an embodiment of this application. In this embodiment, the detection coil is formed by surrounding of a bottom detection coil C and a top detection coil D in a vertical staggered superposition arrangement manner. The bottom detection coil C and the top detection coil D are located on a same vertical plane. Both the bottom detection coil C and the top detection coil D include a plurality of first detection lines, second detection lines, and third detection lines. A length of a first detection line of the bottom detection coil C is less than a length of a first detection line of the top detection coil D, and a length of a second detection line of the bottom detection coil C is greater than a length of a second detection line of the top detection coil D. In this way, the bottom detection coil C and the top detection coil D are inlaid with each other and spaced from each other. In this implementation, the detection lines of the bottom detection coil C are relatively close to the detection lines of the top detection coil D, and a tiny crack can be detected. In comparison with the foregoing four implementations, in this implementation, the detection lines are distributed in a more centralized manner. Therefore, more tiny cracks can be detected and a result is precise in this implementation.

In the foregoing implementations, the detection line unit may be in a Z shape, a V shape, a parabolic shape, or another two-dimensional or three-dimensional shape. In addition, a gap between detection coils is not limited in this application. In theory, a smaller gap between the detection coils results in more densely distributed detection sections. In this way, the detection sections can detect more cracks on the main body, and detection precision is higher.

In an implementation, the detection coil may be embedded inside the main body or exposed on an outer surface of the main body.

In an implementation, the first detection line of the top detection coil and the second detection line of the bottom detection coil may be disposed on the top surface and the bottom surface of the main body, respectively, and another detection coil is embedded inside the main body.

The detection coil is formed by surrounding of a plurality of detection line units that are sequentially connected in series. The detection line unit is a metal conductive wire. The metal conductive wire is soft and thin. When a crack of a substrate passes through the metal wire in an extension process of the crack, the metal wire breaks due to generated tensile stress. A thinner metal conductive wire is better, a thinner metal wire is softer, it is easier for a crack to break the metal wire, the detection coil is more sensitive to the crack, and a detection result is more precise.

Further, the apparatus equipped with a crack detection circuit may determine, by using a connection status of the detection coil, whether a crack exists on a detection region. Specifically, when an external current is supplied to the detection circuit, if the detection coil is energized, it indicates that the metal conductive wire inside the main body does not break. In other words, no crack invades the detection region inside the main body. If the detection coil is not energized, it indicates that the metal conductive wire inside the main body is invaded by a crack and breaks. In other words, a crack exists on the detection region inside the main body.

Further, in each detection line unit, the first detection line and the second detection line extend in a same direction, and the pair of third detection lines extend in a same direction. In an implementation, the main body is a cut unit of a wafer and is also referred to as a wafer level chip. The wafer level chip is made by preparing a plurality of same chips on an entire wafer and then cutting the chips along a cutting street. The apparatus equipped with a crack detection circuit may be pre-embedded in an insulation medium of the wafer level chip, and detects a cutting crack generated in a slicing process of the wafer level chip. The cutting crack may be a horizontal layered crack or a crack in another direction. A chip is used as an example. The detection circuit is disposed in the chip and is an independent circuit. In other words, the detection circuit and a main circuit on the chip are separated and are not electrically connected. Disposing the detection circuit does not affect electrical properties of the main circuit. Therefore, in any case, including an operating state or a non-operating state of the main circuit, the detection circuit can operate properly. In an implementation, the detection circuit is embedded in an idle region, in which the main circuit is not located, of the main body. This does not increase a volume of the main body and ensures that the chip is in a small size.

When the detection circuit is disposed in the chip, a cutting crack is likely to be generated around the chip in a cutting and fragmentation process of the chip due to cutting stress. Therefore, the detection circuit may be distributed internally surrounding side surfaces of the chip. Specifically, detection line units extend and spread along cross sections around the chip, and surround a center axis of the chip. In this way, the detection coil is distributed around the chip. When the chip has a cutting crack or a crack generated due to collision, the detection coil of the chip is invaded in a growth process of the crack. The detection coil breaks due to tensile stress generated in the invasion process, and breaking of the detection coil indicates that a crack exists on the detection region. In this way, validity of the chip is detected.

In another implementation, the main body may be a cut unit of another panel such as a glass substrate or a liquid crystal panel.

Figure 17:
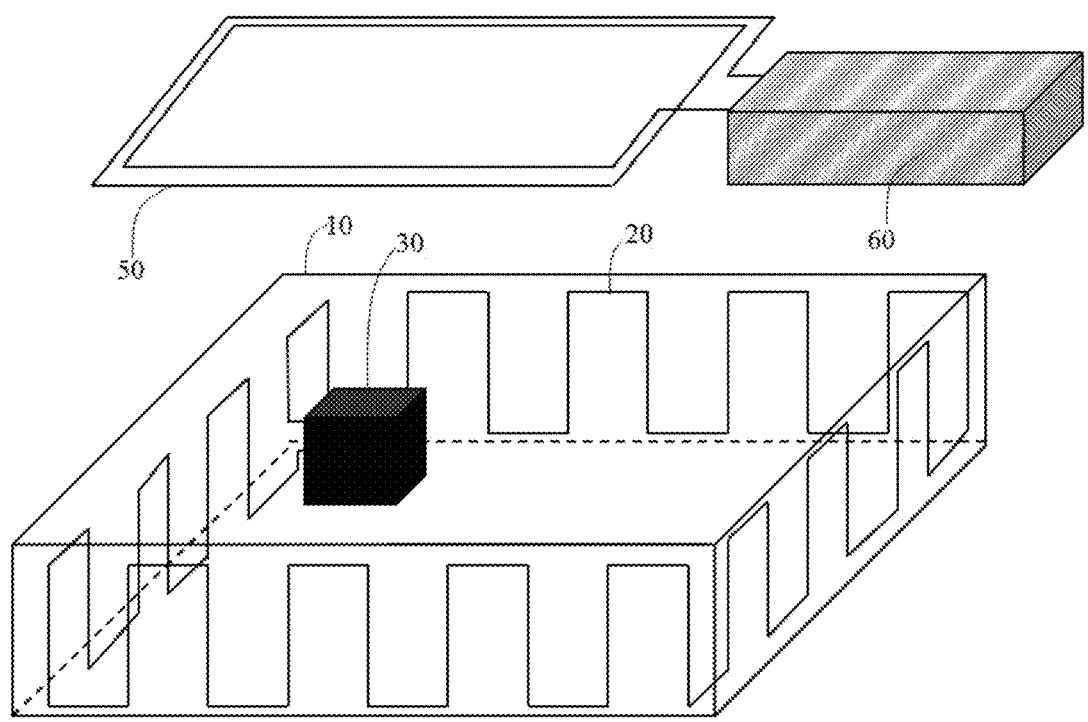
FIG. 17 is a schematic structural diagram of a crack detection system according to an embodiment of this application.
Figures 1, 17:
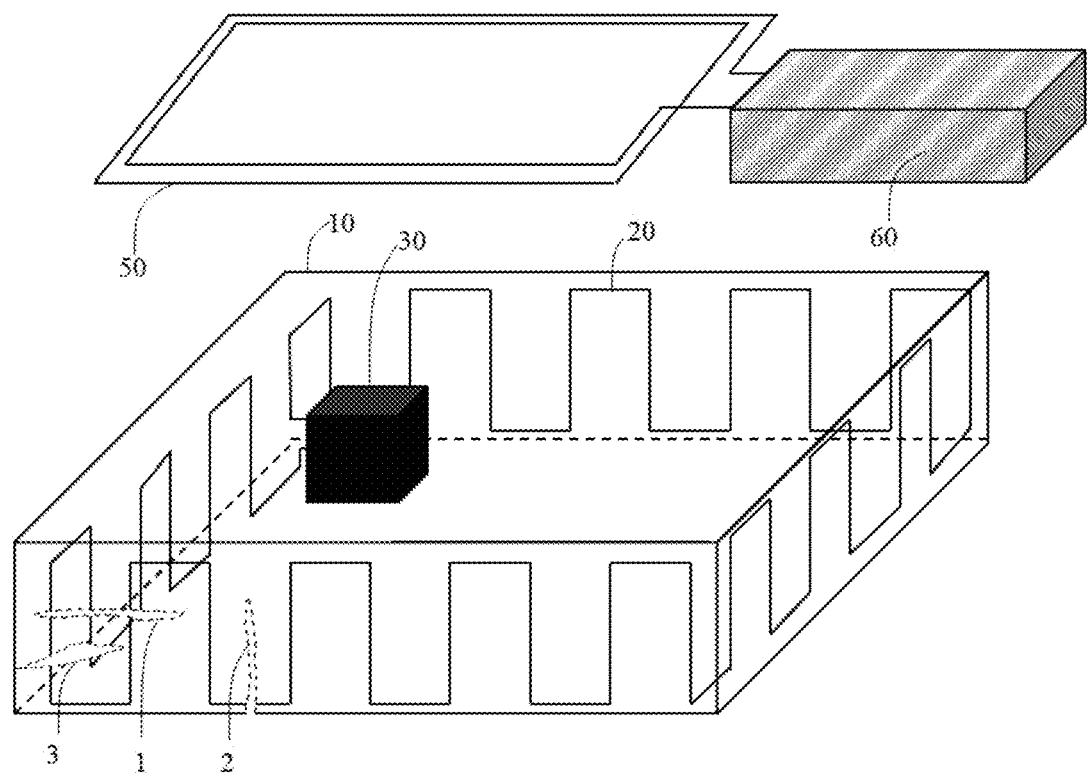

Referring to FIG. 17, FIG. 17 is a schematic structural diagram of a crack detection system according to an embodiment of this application. The crack detection system includes the apparatus equipped with a crack detection circuit according to any one of the foregoing implementations and a detection device. The detection device includes a coupling coil 50 and a detection device control module 60 that are electrically interconnected. The detection device control module 60 is configured to provide an electrical signal for the coupling coil 50, to implement coupling between the coupling coil 50 and the detection coil 20 of the apparatus equipped with a crack detection circuit, so that an induced current is generated to supply power to the detection control module 30 of the apparatus equipped with a crack detection circuit. The detection device detects a crack on the main body 10 by determining connection or disconnection of the detection coil 20.

The apparatus equipped with a crack detection circuit is pre-embedded in a detection region of the main body 10. When the coupling coil 50 of the detection device is close to a bottom surface or a top surface of the main body 10, if no crack exists on the detection region, the detection coil 20 does not break and may be coupled to the coupling coil 50. The detection circuit is energized through the coupling effect, to provide electric energy for the detection control module 30. Then, the detection control module 30 feeds back a feedback signal to the detection device by using the coupling coil 50. The detection device receives the feedback signal and determines that no crack exists on the detection region. If a crack exists on the main body 10, and the pre-embedded detection coil 20 is damaged, that is, the coil is in an open circuit state, the detection coil 20 cannot be coupled to the coupling coil 50. In other words, no coupling electrical signal supplies power to the detection control module 30, and the detection device cannot normally read feedback information from the detection control module 30. In this case, it can be determined that a crack exists on the detection region.

Referring to FIG. 17-1, FIG. 17-1 is a schematic diagram of crack detection performed by a crack detection system according to an embodiment of this application. A detection circuit including a detection coil 20 and a detection control module 30 is pre-embedded inside a main body 10. It is assumed that a horizontal crack 1, a vertical crack 2, and a crack 3 in any direction are generated on an edge of the main body, and the pre-embedded detection coil 20 is damaged; in other words, the coil is in an open circuit state. A coupling coil 50 of a detection device is made close to a bottom surface or a top surface of the main body 10. The detection coil 20 cannot be coupled to the coupling coil 50 due to the open circuit, and no coupling electrical signal supplies power to the detection control module 30. A detection device control module 60 cannot normally read feedback information from the detection control module 30. In this case, the detection device control module 60 may determine that the main body 10 fails due to a crack damage.

In this application, a three-dimensional detection coil may be designed to implement full detection on a crack in any direction inside the main body. In addition, the detection circuit is an independent circuit, does not require power supply from the to-be-detected main body, and may obtain electric energy through the coupling effect between the coupling coil of the detection device and the detection coil. This avoids an increase in complexity of the detection circuit when the detection circuit is connected to an external power supply and avoids a mechanical damage risk caused when the detection circuit is connected to a main circuit. Detection on the coupling effect between the detection device and the detection coil implements wireless non-contact crack detection, and there is no need to be in contact with the to-be-detected main body during a test. This causes no additional damage to the to-be-detected main body. The detection device determines connection or disconnection of the three-dimensional detection coil by using the feedback signal from the detection control module, implementing full detection on a crack in any direction.

In this application, the detection circuit is embedded inside the to-be-detected main body and is an independent circuit. Therefore, in any case, the detection circuit can independently perform detection on a crack on the to-be-detected main body, including production line detection after a cutting and fragmentation process, delivery OQC inspection, incoming inspection for a terminal production line, on-board detection during failure analysis, and the like. An operation is easy, and batch detection can be implemented. A detection speed is high, and precision is high. This resolves a problem that nondestructive non-contact detection on a crack in any direction cannot be performed on a single unit after cutting and fragmentation are performed on a substrate such as a wafer, touchscreen glass, or an LCD.

Figure 18:
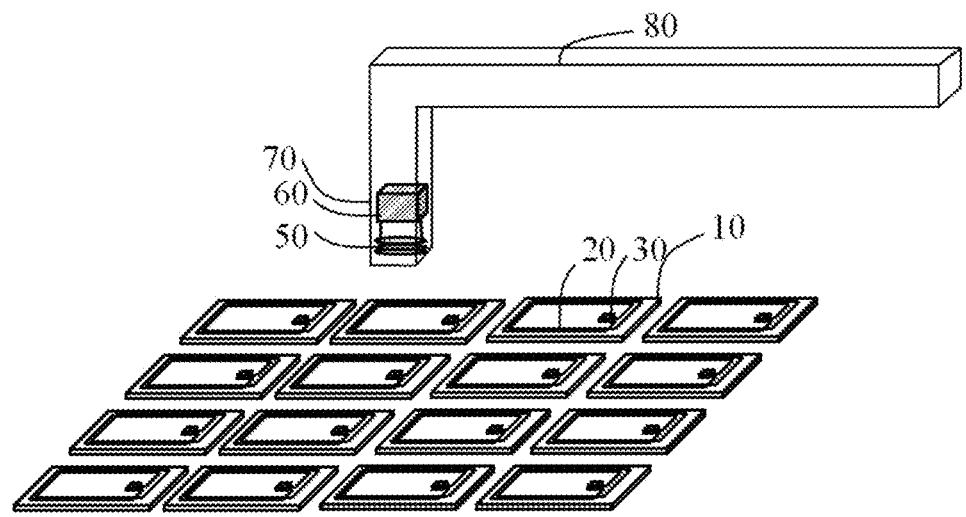
FIG. 18 is a schematic diagram of batch detection performed on a cut and fragmented wafer by an apparatus equipped with a crack detection circuit and a detection system according to an embodiment of this application.

In this application, the apparatus equipped with a crack detection circuit and the detection system may be used in production line detection of a WLCSP chip after a cutting and fragmentation process, delivery OQC inspection, and incoming detection. FIG. 18 is a schematic diagram of batch detection performed on a cut and fragmented wafer by an apparatus equipped with a crack detection circuit and a detection system according to an embodiment of this application. As shown in FIG. 18, a coupling coil 50 and a detection device control module 60 are encapsulated in a detection probe 70 of a detection machine, and the detection probe 70 is controlled by a mechanical arm 80 of the detection machine to move and be located. The coupling coil 50 is made close to a top surface or a bottom surface of a chip unit 10 and is coupled to a detection coil 20 pre-embedded in the chip unit 10. The detection device control module 60 provides electric energy for a detection control module 30 in the chip unit 10 through the coupling effect between the coils, and at the same time, reads a feedback signal from the detection control module 30. If the detection device control module 60 receives the feedback signal from the detection control module 30, it can be determined that the chip unit 10 is a desirable unit. If the detection device control module 60 cannot receive the feedback signal from the detection control module 30, it can be determined that the chip unit 10 is a chip damaged by a crack. In this application, the apparatus equipped with a crack detection circuit and the detection system can implement rapid production line detection, to filter out and intercept a chip that is damaged by a cutting crack after a cutting and fragmentation process, and the chip does not need to be placed on a test bench. In this application, there is no need to separately supply power to the chip. Therefore, a detection method is simple and convenient, and rapid detection can be implemented with low costs.

Figure 19:
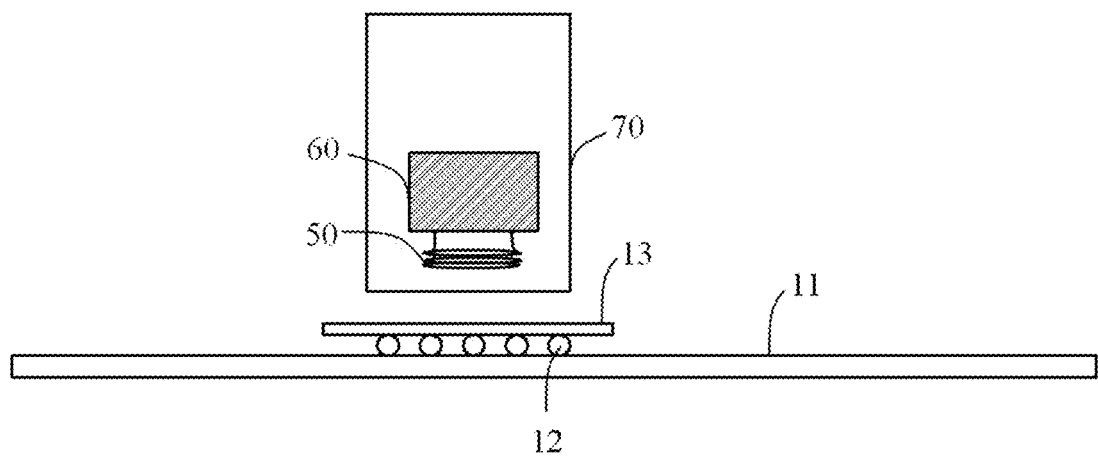
FIG. 19 is a schematic diagram of failure detection performed on a chip of a mainboard by an apparatus equipped with a crack detection circuit and a detection system according to an embodiment of this application.

In this application, the apparatus equipped with a crack detection circuit and the detection system may further be used in a terminal production line of a single unit, a reliability test, and rapid analysis and root cause identification for an EWP failure. FIG. 19 is a schematic diagram of failure detection performed on a chip of a mainboard by an apparatus equipped with a crack detection circuit and a detection system according to an embodiment of this application. As shown in FIG. 19, a detection circuit (not shown) is pre-embedded in a chip unit 13 and is welded onto the mainboard 11 by using a solder ball 12. A coupling coil 50 and a detection device control module 60 are encapsulated in a handheld detection probe 70. When it is suspected that the chip body fails because the chip unit 13 is layered or has an internal crack, the handheld detection probe 70 is made close to a top surface or a bottom surface of the chip unit 13. The detection device control module 60 provides electric energy for the detection circuit of the chip unit 13 through a coupling effect between coils, and at the same time, reads a feedback signal from the detection circuit. If the detection device control module 60 receives the feedback signal, it can be determined that the chip unit 13 does not fail. If the detection device control module 60 cannot receive the feedback signal, it can be determined that the chip unit 13 fails. In this application, when the apparatus equipped with a crack detection circuit and the detection system are configured to perform on-board failure detection, there is no need to supply power to the mainboard, and the detection circuit can be supplied with power by a detection device through coupling during non-contact detection. In addition, nondestructive analysis without slicing or detachment is implemented, greatly simplifying a detection analysis method; and a detection result can be obtained rapidly. This resolves problems that a result of failure analysis after a reliability test is inaccurate and there is no nondestructive analysis method.

The loop antenna and the mobile terminal provided in the embodiments of this application are described in detail above. The principle and implementation of this application are described herein through specific examples. The description about the embodiments is merely provided to help understand the method and core ideas of this application. In addition, a person of ordinary skill in the art can make variations and modifications in terms of the specific implementations and application scopes according to the ideas of this application. Therefore, the content of this specification shall not be construed as a limitation on this application.

What is claimed is:

1. An apparatus, comprising:
a crack detection circuit configured to detect a crack in an edge region of a main body;
the main body coupled to the crack detection circuit and comprising:
a top surface;
a bottom surface; and
a side surface coupled between the top surface and the bottom surface;
a detection control circuit disposed on the main body; and
a detection coil disposed on the main body and distributed on an edge of the main body, wherein at least a part of the detection coil is disposed surrounding the side surface, wherein two ends of the detection coil are electrically coupled to the detection control circuit to form a closed-loop detection circuit, wherein the detection coil comprises a plurality of detection sections sequentially coupled from head-to-tail, wherein adjacent detection sections are non-collinear, wherein the detection coil surrounds the side surface to extend for at least two circles, wherein the at least two circles are arranged in a direction perpendicular to the side surface, and wherein detection line sections of adjacent circles are spaced from each other.

2. The apparatus of claim 1, wherein the detection coil further comprises a plurality of detection line sections sequentially coupled in series, and wherein each detection line section comprises at least two detection sections.

3. The apparatus of claim 2, wherein each detection line section extends in a Z shape.

4. The apparatus of claim 2, wherein each detection line section comprises a first detection line, a second detection line, and a pair of third detection lines, wherein the first detection line extends along an extension direction of an edge of the top surface of the main body, wherein the second detection line extends along an extension direction of an edge of the bottom surface of the main body, wherein a position of the first detection line and a position of the second detection line are staggered, wherein one of the pair of third detection lines is coupled between the first detection line and the second detection line, and wherein the other of the pair of third detection lines is coupled between the second detection line and a first detection line of a neighboring detection line section.

5. The apparatus of claim 4, wherein in each detection line section, the first detection line and the second detection line extend in a first direction, and the pair of third detection lines extends in a second direction.

6. The apparatus of claim 5, wherein the third detection lines are coupled perpendicular to and between the first detection line and the second detection line.

7. The apparatus of claim 2, wherein each detection line section extends in a V shape.

8. The apparatus of claim 2, wherein each detection line section extends in a parabolic shape.

9. The apparatus of claim 1, wherein detection sections of adjacent circles are disposed in the direction perpendicular to the side surface in a staggered manner.

10. The apparatus of claim 1, wherein an outermost detection coil is disposed on the side surface, and wherein another detection coil is embedded inside the side surface.

11. The apparatus of claim 1, wherein the detection coil is embedded inside the main body.

12. The apparatus of claim 1, wherein the main body comprises a chip.

13. The apparatus of claim 1, wherein the detection coil is exposed on an outer surface of the main body.

14. The apparatus of claim 1, wherein the main body comprises a glass substrate.

15. The apparatus of claim 1, wherein the main body comprises a liquid crystal panel.

16. A crack detection system, comprising:
an apparatus, comprising:
a crack detection circuit configured to detect a crack in an edge region of a main body;
the main body coupled to the crack detection circuit and comprising:
a top surface;
a bottom surface; and
a side surface coupled between the top surface and the bottom surface;
a detection control circuit disposed on the main body; and
a detection coil disposed on the main body and distributed on an edge of the main body, wherein at least a part of the detection coil is disposed surrounding the side surface, wherein two ends of the detection coil are electrically coupled to the detection control circuit to form a closed-loop detection circuit, wherein the detection coil comprises a plurality of detection sections sequentially coupled from head-to-tail, wherein adjacent detection sections are non-collinear, wherein the detection coil surrounds the side surface to extend for at least two circles, wherein the at least two circles are arranged in a direction perpendicular to the side surface, and wherein detection line sections of adjacent circles are spaced from each other;
a detection device coupled to the apparatus and comprising:
a coupling coil; and
a detection device control circuit electrically coupled to the coupling coil and configured to:
provide an electrical signal for the coupling coil to implement coupling between the coupling coil and the detection coil of the apparatus and to generate an induced current to supply power to the detection control circuit of the apparatus; and
detect the crack on the main body by determining coupling or decoupling of the detection coil.

17. The crack detection system of claim 16, wherein detection sections of adjacent circles are disposed in the direction perpendicular to the side surface in a staggered manner.

18. The crack detection system of claim 16, wherein an outermost detection coil is disposed on the side surface, and wherein another detection coil is embedded inside the side surface.

19. The crack detection system of claim 16, wherein the detection coil further comprises a plurality of detection line sections sequentially coupled in series, wherein each detection line section comprises at least two detection sections, and wherein each detection line section extends in a Z shape, a V shape, or a parabolic shape.

20. The crack detection system of claim 16, wherein the main body comprises a chip, a glass substrate, or a liquid crystal panel.

* * * * *